US007448467B2

(12) United States Patent
Wright et al.

(10) Patent No.: US 7,448,467 B2

(45) Date of Patent: Nov. 11, 2008

(54) ACOUSTIC ENCLOSURES

(75) Inventors: Julian Wright, Totnes (GB); Thomas Anthony Ryan, Ashton-in-Makerfield (GB)

(73) Assignees: KH Technology Corporation, Georgetown (KY); Sutcliffe Speakman Limited, Ashton-in Makerfield, Lancashire (GB)

( * ) Notice: Subject to any disclaimer, the term of this patent is extended or adjusted under 35 U.S.C. 154(b) by 151 days.

(21) Appl. No.: 10/484,982

(22) PCT Filed: Jul. 26, 2002

(86) PCT No.: PCT/GB02/03432

§ 371 (c)(1),
(2), (4) Date: Aug. 13, 2004

(87) PCT Pub. No.: WO03/013183

PCT Pub. Date: Feb. 13, 2003

(65) Prior Publication Data

US 2004/0251077 A1 Dec. 16, 2004

(30) Foreign Application Priority Data

Jul. 26, 2001 (GB) ................................ 0118170.0

(51) Int. Cl.

*H05K 5/02* (2006.01)
*H05K 5/06* (2006.01)
*H04R 1/20* (2006.01)
*A47B 81/06* (2006.01)
*H04R 1/02* (2006.01)

(52) U.S. Cl. ........................ 181/149; 181/148; 181/199; 381/345; 381/349

(58) Field of Classification Search ................. 181/149, 181/148, 199, 146, 151, 156; 381/345, 354, 381/349

See application file for complete search history.

(56) References Cited

U.S. PATENT DOCUMENTS 4,450,929 A * 5/1984 Marrs ......................... 181/146
4,657,108 A * 4/1987 Ward .......................... 181/151
4,677,019 A * 6/1987 von Blucher ................ 442/227

(Continued)

FOREIGN PATENT DOCUMENTS

CN 1200961 A 12/1998

(Continued)

OTHER PUBLICATIONS

66- Surface Chem., Colloids vol. 112. 1990, p. 445, item 205358a.*

(Continued)

*Primary Examiner*—Edgardo San Martin
(74) *Attorney, Agent, or Firm*—Kenneth L. Sherman, Esq.; Michael Zarrabian, Esq.; Myers Dawes Andras & Sherman, LLP

(57) ABSTRACT

An acoustic enclosure such as a loudspeaker (10) uses within the cabinet adsorbent material, and/or containment means (22) for the adsorbent material, which is at least partially hydrophobic. Preferably, the material is activated carbon treated to provide it with hydrophobic properties. Preferably, the adsorbent material is treated with a silicon-containing compound. This improves the acoustic compliance of the acoustic enclosure.

11 Claims, 2 Drawing Sheets

U.S. PATENT DOCUMENTS

| | | | | | |
|---|---|---|---|---|---|
| 4,978,650 | A | * | 12/1990 | Coughlin et al. | 502/432 |
| 5,080,743 | A | * | 1/1992 | Odajima | 156/243 |
| 5,997,954 | A | * | 12/1999 | Decker et al. | 427/387 |
| 6,743,516 | B2 | * | 6/2004 | Murphy et al. | 428/447 |
| 6,758,876 | B2 | * | 7/2004 | Suzuki et al. | 55/385.6 |
| 6,857,340 | B2 | * | 2/2005 | Wagner | 62/6 |
| 2004/0182240 | A1 | * | 9/2004 | Bause et al. | 95/146 |

FOREIGN PATENT DOCUMENTS

| | | | | |
|---|---|---|---|---|
| DE | A-2042729 | | | 3/1972 |
| EP | A-0765840 | | | 2/1997 |
| GB | 2378082 | A | * | 1/2003 |
| GB | 2391224 | A | * | 2/2004 |
| JP | A-55-023039 | | | 2/1980 |
| JP | 1-55-041848 | | | 3/1980 |
| JP | A-62-128909 | | | 6/1987 |
| JP | A-10-214755 | | | 8/1998 |

OTHER PUBLICATIONS

Partial English Language translation of response to Aug. 24, 2007 Office Action, issued in Chinese Application No. 02814826.6.

* cited by examiner

ACOUSTIC ENCLOSURES

FIELD OF THE INVENTION

This invention relates to acoustic enclosures such as loudspeakers, and in particular to the achievement of maximum bass performance from a minimum size of loudspeaker cabinet.

BACKGROUND TO THE INVENTION

Numerous attempts have been made to extend the low frequency performance of small loudspeaker systems. However, none of these have so far proved to be successful commercially.

In GB2146871B there is described a technique for eliminating or substantially eliminating pressure variations in an essentially closed volume, such as the interior of a loudspeaker cabinet. The essentially closed volume of the cabinet is effectively reduced in volume when the loudspeaker cones make excursions into the interior of the cabinet. Such excursions tend to increase the pressure in the cabinet and these pressure variations are reduced by locating a mass of material within the cabinet, the material being adsorbent to the gas or vapour in the cabinet. The adsorbing material can be a mass of activated charcoal or carbon in granular form. The granules are described as being held in place by a mesh-like support structure which can be a moulding of plastics material or formed from expanded metal sheet. This can be lined with a porous fabric such as filter paper to prevent small granules from passing through the support structure.

In GB2146871B it is mentioned that it is desirable to keep the carbon granules free from moisture. Methods of attempting to achieve this described in the aforesaid patent specification include the provision of a moisture impermeable diaphragm located within the box between the granules and the speakers, and also the use of a moisture barrier to prevent moisture from entering the region of the mass of carbon granules.

U.S. Pat. No. 5,857,340 discloses the use of carbon for preferential adsorption of one of a mixture of gases in the acoustic resonator of a thermoacoustic resonator.

U.S. Pat. No. 5,080,743 discloses a method of forming an acoustic diaphragm formed wholly from carbonaceous materials, including crystals of graphite.

Although the use of adsorbent materials in acoustic enclosures may be beneficial, there exist problems with the practical use of such materials.

When a loudspeaker cone moves backwards, the air in the box is compressed slightly. In a conventional loudspeaker this results in a pressure increase which acts to impede the movement of the cone. In a cabinet in accordance with the invention, the pressure increase is smaller because some of the air molecules are momentarily joined to the surface of the carbon granules (adsorbed). So the impedance to motion is significantly reduced. When the cone moves forwards the air molecules are desorbed by the resulting pressure decrease.

One can think of this adsorption as a (temporary) reduction of air density. The acoustic compliance of air in the loudspeaker cabinet is given by:

$$C_A=V_B/\rho c^2$$

where $V_B$ is the nett enclosure volume $\rho$ is the density of air c is the velocity of sound in air Therefore a reduction in density produces an increase in compliance, equivalent to enlarging the enclosure.

This stiffness reduction or compliance enhancement can be as much as four times or more under optimum conditions. Factors of 1.5 to 3 are readily achievable in practice.

The compliance enhancement achieved with the present invention is principally effective at low frequencies, as shown in FIG. 1. At higher frequencies than about 200 Hz performance deteriorates because the cycle time becomes too short for adsorption and desorption fully to take place.

There is a strong relationship between the tendency of an activated carbon to adsorb air and its tendency to adsorb water vapour. Adsorption of water vapour adversely affects compliance enhancement because the water molecules block the pores and prevent air adsorption. Therefore the carbon must be kept as dry as possible, and its "water uptake" should be minimal.

SUMMARY OF THE INVENTION

The approach, which is the subject of the present invention, is to use adsorbing material and/or the containment means for it which is at least partially hydrophobic, i.e. water-repellent. In this way one can achieve acoustic compliance enhancement of the loudspeaker, i.e. an improvement in the acoustic compliance. In other words, the loudspeaker cabinet can be made to seem acoustically bigger without any physical change to the cabinet. Alternatively, the same acoustic output can be obtained with a cabinet of smaller size.

In addition to being used within loudspeaker cabinets, such adsorbent materials may also be used in other types of acoustic enclosures. In particular, sound recording studios have walls which incorporate air gaps, wadding and the like in order to improve sound proofing. Instead of, or in addition to, such traditional features, such rooms may incorporate the hydrophobic adsorbent material of the invention, conveniently located within the walls of the room. The thickness of sound-proofing structures in the walls may then be reduced, thus increasing the usable space of the room.

In accordance with one aspect of the present invention there is provided an acoustic enclosure within which there is an adsorbent material which is or which has been treated to make it at least partially hydrophobic.

In accordance with another aspect of the present invention there is provided an acoustic enclosure within which there is located adsorbent material which is within containment means which is or which has been treated to be at least partially hydrophobic.

Clearly, it would also be possible within the scope of the invention both to use hydrophobic adsorbent material and also to make the containment means water-repellent as well.

The adsorbent material is preferably activated carbon, suitably treated to provide it with hydrophobic properties.

Preferably, the adsorbent material comprises a silicon-containing compound.

Other materials which could be used include alumina, silica, zeolite and aerogel, which are highly adsorbent.

A factor which needs to be considered in the design of a loudspeaker cabinet containing such compliance enhancement material is how the material is to be presented to the air. Desirably, one needs to achieve maximum exposure of surface area to the air within the cabinet. Whether one uses hydrophobic carbon and/or a water-repellent containment material, it is desirable not to use a large solid mass of compliance enhancement material, but to use a modular arrangement, for example of tubular bags of material linked together by webbing. Such tubular bags can be laid in layers, at right angles to one another, to give little contact between the individual bags and an optimum surface area of exposure to the air.

Alternatively, a number of tubular bags of material can be arrayed in the form of a curtain within the cabinet, again with a view to achieving maximum exposure of the material to the air.

If the compliance enhancement material, such as hydrophobic carbon, is contained within a bag or bags, the bag material can be a multi-filament synthetic textile material.

References herein to the compliance enhancement material being hydrophobic is not intended to exclude materials which are not 100% hydrophobic. The invention is intended to cover compliance enhancement materials which have been treated to improve their hydrophobic qualities, even if they cannot be said to be truly hydrophobic. The same is true in respect of the containment material. Material treated to improve its water-repellent characteristics is to be regarded as falling within the scope of the present invention, even if the material is not then 100% water-repellent.

BRIEF DESCRIPTION OF THE DRAWINGS

The invention will now be described in more detail, by way of example, and with reference to the accompanying drawing, in which.

DESCRIPTION OF THE PREFERRED EMBODIMENTS

Figure 1:
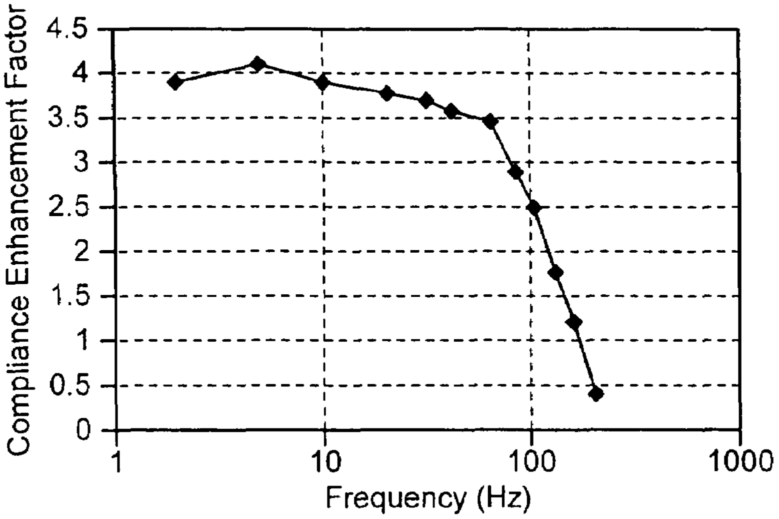
FIG. 1 is a graph showing the compliance enhancement factor plotted against frequency for a typical loudspeaker in accordance with the invention.
Figure 2:
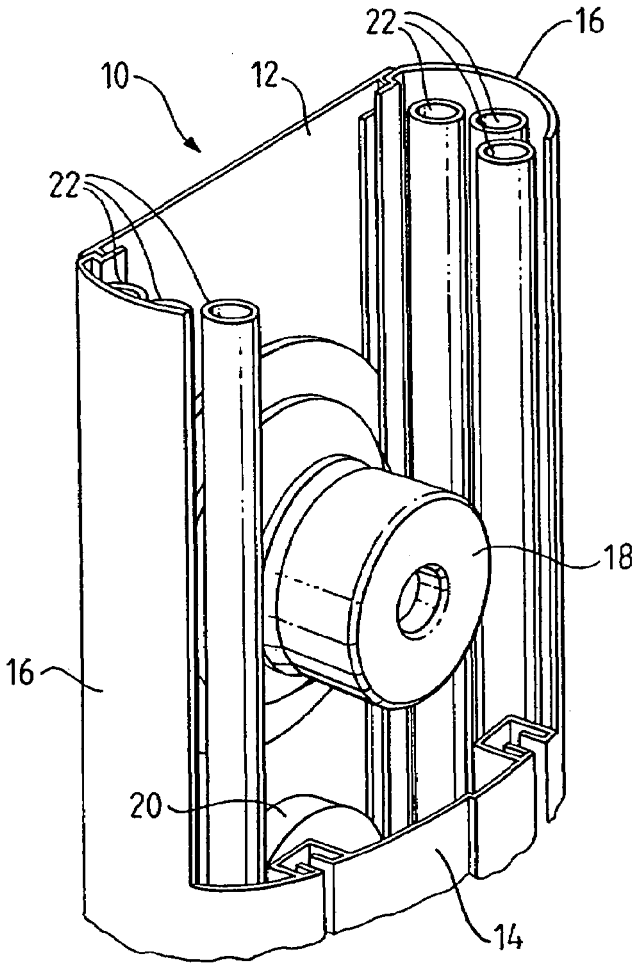
FIG. 2 is a view, partly cut away, of a loudspeaker cabinet in which adsorbent material is encased in vertically arranged tubular modules; and, FIG. 3 is a graph of water adsorption isotherms of treated and untreated activated carbons.

FIG. 2 shows a loudspeaker cabinet 10 with a front wall 12, rear wall 14 and side walls 16. Two drive units 18, 20 are shown. Each side wall 16 is curved to accommodate a plurality of vertical tubular bags 22 containing compliance enhancement material in accordance with the invention. The bags 22 may be linked together on each side of the cabinet by webbing. The bag material can be a multi-filament synthetic textile material. The bags thus function as curtains within the enclosure and present a large surface area.

It has been found that the treatment of activated carbons with certain agents increases their hydrophobicity, i.e. that they adsorb less water than untreated carbons, at a certain relative humidity. In particular, the treatment of carbons with silicon-containing compounds can increase their hydrophobicity. Suitable silylating agents include both activated compounds (eg silyl halides and esters) and non-activated compounds (eg silyl alcohols) with a range of substituents, and include those having the following general formulae:

$$R_1R_2R_3Si—(CH_2)_n—OH$$

$$R_1R_2R_3Si—Hal$$

$$R_1R_2R_3Si—X—Si—R_4R_5R_6$$

$$R_1Si(OR_2)(OR_3)(OR_4)$$

$$R_1R_2R_3R_4Si$$

where n=0-20

X=O, S or $NR_1$

Hal=Halogen and each of $R_1$, $R_2$, $R_3$, $R_4$, $R_5$ and $R_6$ is independently selected from the group consisting of, hydrogen, optionally substituted, branched and unbranched alkyl, alkenyl, alkynyl or aryl groups.

Specific examples of such R groups include H, Me, Et, Pr, n-Bu, iso-Bu, tert-Bu, allyl, phenyl etc, and specific examples of suitable silylating agents include:

trimethylsilyl ethanol (TMSE)
hexamethyldisiloxane (HMDSO)
methyltrimethoxysilane (MTMS)
propyltrimethoxysilane (PTMS)
iso-butyltriethoxysilane (i-BTES)
octyltriethoxysilane (OTES)

The silylating agent or agents may be incorporated in the carbon in a number of ways. The carbon may be dipped into a solution of the silylating agent and then dried, or it can be sprayed with the silylating agent, or the silylating agent may be vapourised and adsorbed onto the carbon, or the carbon may be chemically activated prior to or during these steps, for example by treatment with a catalyst or base and treatment with an activated compound such as tert-butyldimethylchlorosilane. These steps may be performed at, below or above ambient pressure and temperature.

Examples of the incorporation of silylating agents into activated carbons will now be described, along with properties of the resultant treated carbons.

Experimental

All of the starting materials and reagents used herein are commercially available or have published syntheses. For example, a range of untreated activated carbons are available from Sutcliffe Speakman Carbons Ltd of Lockett Road, Ashton-in-Makerfield, Lancashire, WN4 8DE, UK. The silicon-containing compounds are available from such sources as the Sigma-Aldrich Company Ltd of The Old Brickyard, New Road, Gillingham, Dorset, SP8 4BR, UK.

Organosilane Impregnation Method

A quantity of granular activated carbon, which had been pre-conditioned at 120° C. for a minimum of 4 hours in a fan assisted drying oven then cooled to ambient conditions in a desiccator over silica gel, was accurately weighed into a glass dish fitted with a ground glass lid. The glass dish and weighed activated carbon were placed into a temperature controlled heated oven together with the separate ground glass sealing lid. The oven temperature set-point was dependent upon the respective boiling point of the organosilane (or organosilyl) impregnant. An oven temperature of 20° C. higher than the corresponding organosilane boiling point was required.

The amount of organosilane compound to be added was calculated such that it would produce the degree of impregnation required with respect to the weighed activated carbon. The required amount of organosilane-based liquid was weighed into a small glass phial which was then carefully placed, separately, with the heated activated carbon within the glass dish. The heated dish and contents were then sealed by the lid and replaced into the heated oven. Frequent visual inspection determined when full vaporisation/adsorption of the organosilane compound onto the heated adsorbent carbon had been achieved. The sealed glass dish and contents were removed from the hot oven and cooled. The increase in carbon weight was determined.

Percentage weight/weight organosilane-based addition was calculated by:—

$$\%\ w/w\ \text{additive} = A \times 100/(C+A)$$

where C=original weight of carbon
where A=weight increase of carbon

Example 1

Trimethylsilylethanol (TMSE) 3% w/w Addition

Activated carbon: Highly activated coconut shell
Dried carbon weight: 1.9400 g
Boiling point TMSE: 73° C.
Oven temperature: 93° C.
Weight increase: 0.06 g
% w/w TMSE: 0.06×100/(1.94+0.06)=3.0%

Example 2

Hexamethyldisiloxane (HMDSO) 6% w/w Addition

Activated carbon: Highly activated coconut shell
Dried carbon weight: 1.8800 g
Boiling point HMDSo: 101° C.
Oven temperature: 121° C.
Weight increase: 0.12 g
% w/w HMDSO: 0.12×100/(1.88+0.12)=6.0% w/w addition Determination of Water Uptake as a Function of Relative Pressure at 25° C.

In determining the property of water adsorption, a dynamic method involving the adsorption of water vapour from a generated air stream was considered as the most suitable which would represent adsorption conditions envisaged in practice. An experimental rig, as briefly described below, was constructed to generate air/water mixtures. "Pyrex" glassware and standard ground glass joints were employed throughout.

A flow of air was dried and purified by passage through a series of towers containing activated carbon, silica gel, and silica gel+soda lime respectively. The conditioned air stream was divided to pass through two calibrated flow rotameters. The two air streams from the flowmeters were directed though separate glass spirals, which were immersed in a thermostatically controlled water bath at 25° C. One air stream was saturated with water by passage through a series of two bubbler saturators. The water saturated air stream was then mixed with a controlled flow of air from the second flowmeter in a mixing bottle immersed in the water bath at 25° C. The mixed air stream was passed through a sorption tube at 25° C. that contained a weighed quantity of pre-dried activated carbon.

By controlling and measuring the air flows through the flowmeters it was possible to calculate the partial pressure of water vapour in the resulting mixed air stream.

If $a_1$ is the flowrate through the water saturators and $a_2$ that of the pure air stream admixed, and $a_3$ the increase in rate due to the water vapour then the vapour pressure of water, P, is given by: $P=(a_3 \times P_A)/a_1+a_2+a_3)$ and $Ps=(a_3 \times P_A)/(a_1+a_2)$, where $P_A$ is atmospheric pressure and Ps the saturation vapour pressure of water at the temperature of the test. Combining the two equations, the relative pressure of the water vapour is given by:—

$$P/Ps=a_1/(a_1+a_2)-(a_2Ps/P_A)$$

In practice about 0.5 g of pre-dried carbon sample was accurately weighed into a previously weighed sorption tube, which was attached to the mixed flow of humidified air at a set partial pressure. The carbon was allowed time to attain equilibrium with the water vapour air stream. At intermittent times the sorption tube was removed, stoppered and weighed. This procedure was repeated until constant weight had been achieved. Flow rates were then altered to produce a higher partial pressure of water vapour and so on until sufficient points had been obtained to construct the adsorption isotherm. The carbon was then subjected to an airstream flow saturated with water until equilibrium had been achieved.

In constructing the adsorption curve the water uptake as g uptake/100 g carbon was plotted against the relative pressure of water vapour P/Ps (i.e. % Relative Humidity).

Results and Discussion

This observation can be attributed to the reduction of moisture uptake by the activated carbon as recorded in Table 1 in which LM 056 and LM 058 represent laboratory samples of activated carbon impregnated with 2.1 and 3.0% of the trimethylsilylethanol (TMSE), respectively.

TABLE 1

Trimethylsilylethanol additions - Effect upon Water Uptake

| | | Reference No. | | |
|---|---|---|---|---|
| | | 1 (control) | 2 | 3 |
| | | Trimethylsilylethanol/% w/w | | |
| | | None | 2.1% | 3.0% |
| P/Po | R.H | Water Uptakes /% | | |
| 0 | 0 | 0 | 0 | 0 |
| 0.407 | 40.7 | 5.2 | 3.2 | 1.9 |
| 0.499 | 49.9 | 10.1 | 7.1 | 3.0 |
| 0.606 | 60.7 | 21.7 | 16.3 | 6.5 |
| 0.696 | 69.6 | 34.9 | 23.0 | 10.0 |
| 0.805 | 80.5 | 64.0 | 35.4 | 19.5 |
| 0.901 | 90.1 | 64.9 | 53.2 | 39.8 |
| 1.0 | 100 | 67.0 | 55.7 | 41.4 |

(The activated carbon used was highly activated coconut shell)

Table 1 shows that water uptake has been reduced to around a third of the original value between 60 and 80% R.H. Measurement of the CTC value after impregnation with 3.0% of the TMSE showed a value of 95% relative to an original CTC value of 111%. This is a small reduction compared to the reduction in water uptake.

Figure 3:
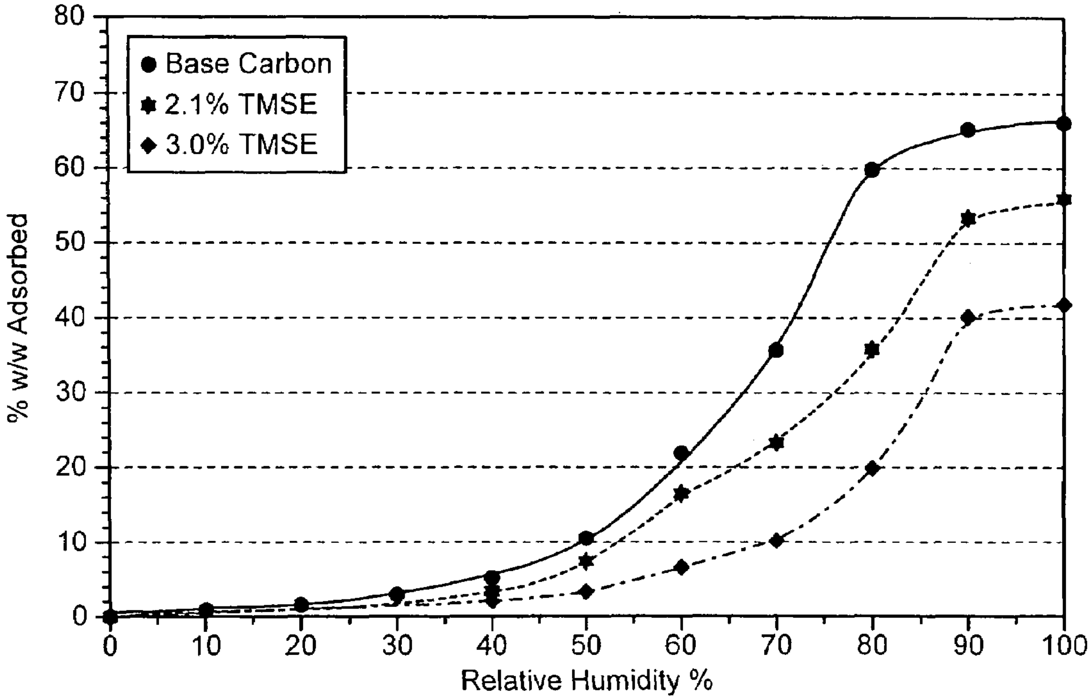

FIG. 3 is an illustration of the tabulated data and clearly demonstrates that impregnation of the TMSE significantly reduces water uptake throughout the range of relative humidities 0-100%.

Further exemplification is presented in Table 2. This shows the diminution in water uptake for the activated carbon impregnated with a range of organosilyl compounds at 60 and 80% relative humidities:

| | | |
|---|---|---|
| TMSE | Trimethylsilyl ethanol | $((CH_3)_3$—Si—$CH_2CH_2OH)$ |
| HMDSO | Hexamethyldisiloxane | $(CH_3)_3$—Si—O—Si—$(CH_3)_3$ |
| MTMS | Methyltrimethoxysilane | $CH_3$—Si—$(OCH_3)_3$ |
| PTMS | Propyltrimethoxysilane | $CH_3CH_2CH_2$—Si—$(OCH_3)_3$ |
| i-BTES | iso-butyltriethoxysilane | $(CH_3)_2CHCH_2$—Si—$(OC_2H_5)_3$ |
| OTES | Octyltriethoxysilane | $CH_3(CH_2)_7$—Si—$(OC_2H_5)_3$ |

TABLE 2

Water Uptake at 60 & 80% RH

| Ref no. | Compound | Compound Addition (% w/w) | 60% RH Uptake g/100 g | 80% RH Uptake g/100 g |
|---|---|---|---|---|
| 4 (control) | None | 0 | 21.7 | 64.0 |
| 5 | TMSE | 2.1 | 16.3 | 35.4 |
| 6 | TMSE | 3.0 | 6.5 | 19.5 |
| 7 | HMDSO | 1.6 | 14.1 | 33.5 |
| 8 | HMDSO | 3.1 | 9.8 | 32.7 |
| 9 | HMDSO | 5.6 | 10.0 | 25.2 |
| 10 | MTMS | 5.2 | 7.2 | 27.5 |
| 11 | PTMS | 5.2 | 7.3 | 29.9 |
| 12 | i-BTES | 5.8 | 5.1 | 25.0 |
| 13 | OTES | 6.1 | 6.3 | 29.1 |

It is to be appreciated that these water-adsorption data are in respect of the equilibrated adsorption of water onto the carbon. It was noted that the dynamic rate of adsorption of water onto the treated carbons was reduced with respect to that of the untreated carbons.

The invention claimed is:

1. A sound system, comprising:

an acoustic enclosure comprising a loudspeaker cabinet;

containment means substantially enclosed in the acoustic enclosure; and an adsorbent material located within the containment means and having sound-improving effect on the sound system as a result of its adsorbing and desorbing gases contained in the enclosure at frequencies falling within the sound frequency range of the sound system;

wherein the adsorbent material is or has been treated to be at least partially hydrophobic, and is adapted to momentarily adsorb air molecules when an air pressure within the containment enclosure increases, and wherein the adsorbent material is further adapted to enhance acoustic compliance of air in the sound system in a low frequency regime with a frequency of less than 200 Hz.

2. The sound system of claim 1, wherein the adsorbent material comprises activated carbon.

3. The sound system of claim 1, wherein the adsorbent material is or has been treated with a silicon-containing compound, in order to be at least partially hydrophobic.

4. The sound system of claim 3, wherein the silicon-containing compound is selected from:

$R_1R_2R_3Si—(CH_2)_n—OH$, $R_1R_2R_3Si—Hal$, $R_1R_2R_3Si—X—Si—R_4R_5R_6$, $R_1Si\ (OR_2)(OR_3)(OR_4)$, and $R_1R_2R_3\ R_4Si$;

where n=0-20,

X=O, S or NR,

Hal=halogens, and wherein each of $R_1$, $R_2$, $R_3$, $R_4$, $R_5$ and $R_6$ is independently selected from the group consisting of:

hydrogen, optionally substituted, branched and unbranched alkyl, alkenyl, alkynyl and aryl groups.

5. The sound system of claim 3, wherein the silicon-containing compound is selected from:

trimethylsilyl ethanol (TMSE), hexamethyldisiloxane (HMDSO), methyltrimethoxysilane (MTMS), propyltrimethoxysilane (PTMS), iso-butyltriethoxysilane (i-BTES), and octyltriethoxysilane (OTES).

6. The sound system of claim 3, wherein the adsorbent material comprises the silicon-containing compound in an amount of from about 0.1 wt % up to about 20 wt %.

7. The sound system of claim 6, wherein the adsorbent material comprises the silicon-containing compound in an amount of from about 3 wt % up to about 6 wt %.

8. The sound system of claim 1, wherein the containment means comprises a plurality of separate modules containing the adsorbent material.

9. The sound system of claim 8, wherein the containment means comprises a plurality of bags coupled together.

10. The sound system of claim 8, wherein the containment means comprises a plurality of tubes linked by webbing.

11. The sound system of claim 8, wherein the containment means comprises a multi-filament synthetic textile material.

* * * * *